(12) United States Patent
Bader

(10) Patent No.: US 6,256,087 B1
(45) Date of Patent: Jul. 3, 2001

(54) LIGHT INTENSITY MEASUREMENT SYSTEM

(75) Inventor: Dieter Bader, Schwäbisch Gmünd (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/096,400

(22) Filed: Jun. 11, 1998

(30) Foreign Application Priority Data

Jun. 12, 1997 (DE) .............................. 197 24 903

(51) Int. Cl.$^7$ ............................ G03B 27/42; G03B 27/54
(52) U.S. Cl. ................................................ 355/67; 355/53
(58) Field of Search ..................... 355/50, 53, 67, 355/77; 356/399–400; 250/458, 492.2, 492.22; 359/209, 211

(56) References Cited

U.S. PATENT DOCUMENTS

| | | | | |
|---|---|---|---|---|
| 4,303,855 | * | 12/1981 | Bapst et al. ............................ | 250/226 |
| 4,780,747 | | 10/1999 | Suzuki et al. ........................... | 355/68 |
| 5,286,963 | * | 2/1994 | Torigoe ............................. | 250/201.2 |
| 5,309,198 | * | 5/1994 | Nakagawa ............................... | 355/67 |
| 5,323,207 | * | 6/1994 | Ina ........................................ | 355/53 |
| 5,329,336 | * | 7/1994 | Hirano et al. ........................... | 355/53 |
| 5,489,966 | * | 2/1996 | Kawashima et al. ................... | 355/43 |
| 5,555,470 | * | 9/1996 | Cole et al. ........................... | 356/35.5 |
| 5,591,958 | * | 1/1997 | Nishi et al. .......................... | 250/205 |
| 5,889,580 | * | 3/1999 | Jasper et al. .............................. | 355/67 |
| 6,028,660 | * | 2/2000 | Van Der Laan et al. .............. | 355/67 |

FOREIGN PATENT DOCUMENTS

| | | |
|---|---|---|
| 296 13 089 U1 | 7/1996 | (DE) . |
| 0 766 144 A1 | 9/1996 | (EP) . |
| 0 500 393 B1 | 11/1997 | (EP) . |
| WO 97/31298 | 8/1997 | (WO) . |

OTHER PUBLICATIONS

European Search Report, EP 98 10 8864, Sep. 6, 2000.

\* cited by examiner

*Primary Examiner*—David M. Gray
*Assistant Examiner*—Hung Henry Nguyen

(57) ABSTRACT

A light intensity measurement system in an illumination system of a projection illumination system for microlithography. The light intensity measurement system includes an adjustable diaphragm that reflects light back into a light-mixing glass rod. The light-mixing glass rod includes a deflecting mirror that transmits a fraction of the light intensity and an energy sensor that senses the transmitted fraction of light intensity. An adjustable diaphragm is arranged following the glass rod in the direction of light flow. The reflected light, in part, also reaches the energy sensor. A compensation detector containing a photodetector is arranged at the deflecting mirror in the main direction of the light reflected by the adjustable diaphragm.

7 Claims, 1 Drawing Sheet

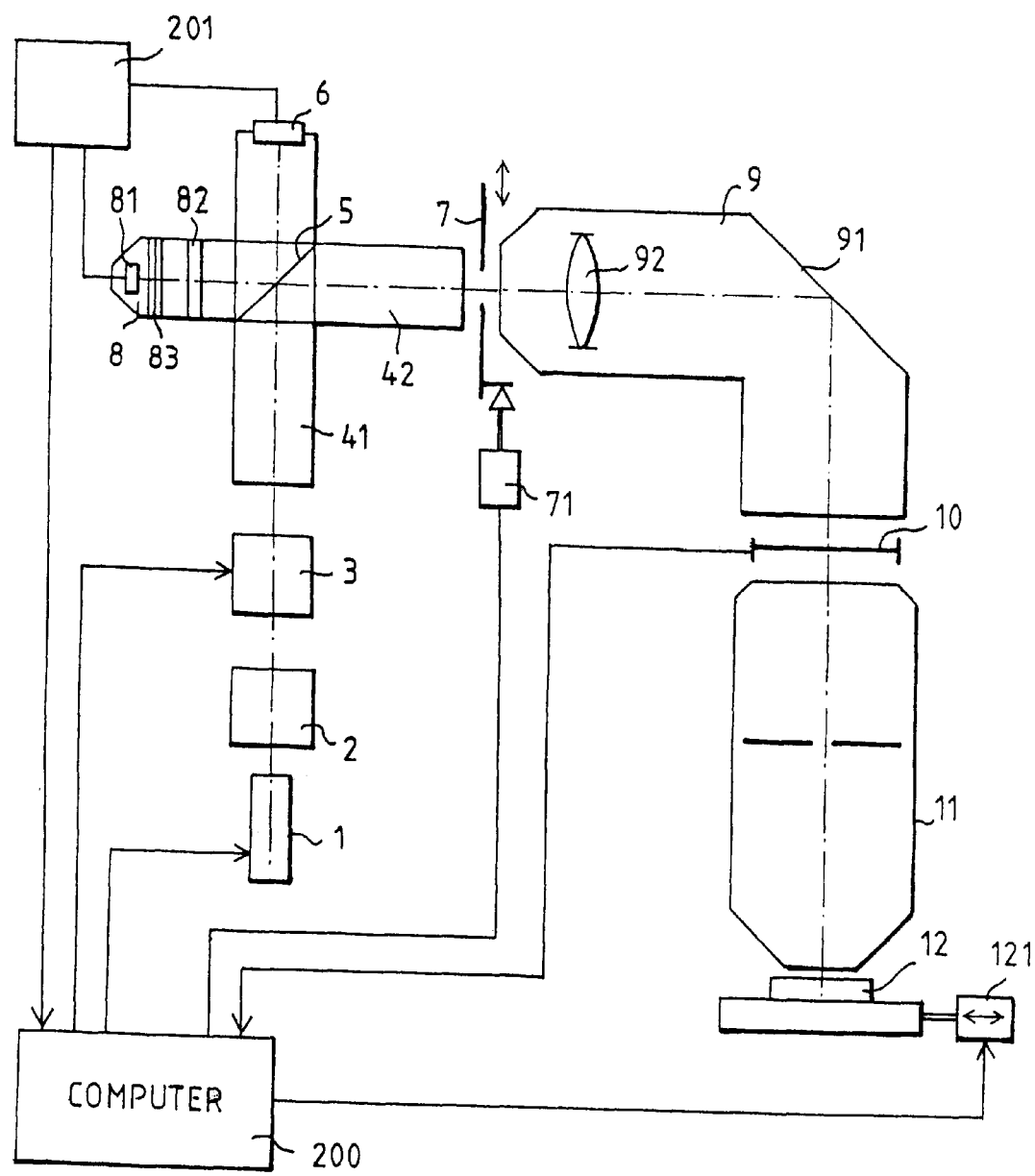

LIGHT INTENSITY MEASUREMENT SYSTEM

BACKGROUND OF THE INVENTION

1. Field of the Invention

The invention relates to a light intensity measurement system and more particularly, to a light intensity measurement system of a projection illumination system for microlithography.

2. Description of Relevant Art

Such systems are in use in wafer steppers or scanners of the ASM-L Company, with optics of the Carl Zeiss Company, Oberkochen, Germany. International patent publication WO 97/31298 is a related publication. Such systems are also known from European Patent 0 500 393 B1 (FIG. 13).

The measurement of light intensity—and thereby the energy, after integration over time—serves for the precise exposure of photoresists, and also as an input magnitude for control circuits by means of which the effects of the light flux on the optical elements (lens heating, thermal lenses) are stabilized.

Problems of measurement accuracy arise with increasing requirements for the accuracy of the whole exposure system and process, and with increasing variability of the whole system, particularly at the exit of the glass rod used in the system, with the variable adjustment of a reticle masking diaphragm whose diaphragm lamellae give rise to considerable reflections back into the glass rod.

SUMMARY OF THE INVENTION

The invention has as its object the provision of such a system with improved measurement accuracy and with greater flexibility of adjustment of the illumination system.

This object is attained by means of a light intensity measurement system in an illumination system of a projection illumination system for microlithography, with a light-mixing glass rod which includes a deflecting mirror that transmits a fraction of the light intensity, and an energy sensor that senses the transmitted fraction of the light intensity. An adjustable diaphragm is following after the glass rod in the direction of light flow. The diaphragm reflects light back into the glass rod, which light in part reaches the energy sensor. A compensation detector containing a photodetector is arranged near the deflecting mirror, in the main direction of the light reflected by the adjustable diaphragm.

BRIEF DESCRIPTION OF THE DRAWINGS

The invention will now be described in detail with reference to the accompanying drawing that shows a schematic overview of a microlithography projection illumination system with a light intensity measurement system according to the invention.

DETAILED DESCRIPTION OF A PREFERRED EMBODIMENT

The microlithography projection illumination system shown in FIG. 1 has an excimer laser 1 as the deep ultraviolet (DUV) light source. A mirror arrangement 2 serves for coherence reduction and beam shaping. The zoom axicon objective 3 makes possible low-loss setting of classical and ring aperture illumination, with different degrees of coherence. A glass rod with two partial sections 41, 42 and a deflecting mirror 5 (provided here for reasons of the geometry of the whole apparatus) serves for homogenization of the illumination. Adjoining the glass rod is an adjustable reticle masking diaphragm 7 with an adjustment drive 71. The reticle marking (REMA) objective 9 gives a sharp-edged image of the opening of the reticle masking diaphragm 7 on the reticle 10, so that precisely that region of the mask that is to be transferred to the wafer 12 is illuminated. The projection objective 11 forms on the wafer 12 a reduced image of the mask on the reticle 10.

A deflecting mirror 91 is also provided in the REMA objective 9, in order to match the dimensions of the apparatus to those required. One lens 92 is shown as representative lens of this REMA objective 9.

The mirror 5 is made partially transmissive; preferably, it has small holes in the silvering. A small fraction of the laser light is thus supplied to the energy sensor 6, a photodiode. Fluctuations of the power of the laser 1 can thus be sensed, and the exposure time of the wafer 12 can be optimally controlled.

The requirements on the reticle mask diaphragm 7, which must have a variable cross section with an edge always lying very precisely in a plane, and which is arranged as close as possible to the exit end of the glass rod 41, 42, results in considerable reflectivity (about 65%) in the DUV light, and that considerable reflected light comes back to the partially transmissive mirror 5. Thus, scattered light also reaches the energy sensor 6 and falsifies its readings. However, measurement accuracy of under 5 per thousand, preferably 1–2 per thousand and better, is required.

According to the invention, a compensation detector 8 is therefore arranged in an extension of the exit side portion 42 of the glass rod, behind the partially transmissive mirror 5. Its photodetector 81 is preceded by a filter packet (combined from blue-transmitting glass (BG) and ultraviolet-transmitting glass (UG) filter), which absorbs scattered radiation, and optionally a scattering disk 82, which serves to make the radial intensity distribution of the reflected light independent of the position of the reticle masking diaphragm 7. Furthermore, the compensation detector 8 is designed as a light trap for the DUV light, with corresponding non-reflecting surfaces in a geometry which prevents reflection back to the mirror 5 and the energy sensor 6.

A calculator unit 201 subtracts the noise fraction "el×k" of the reflected light from the raw measurement value "es" of the energy sensor 6. The former results from the measurement value "er" of the photodetector 81, multiplied by the calibration factor "k".

For the determination of the calibration factor "k", "$es^{72}$" and "$el^{72}$" are determined at a given setting of the reticle mask diaphragm 7, preferably at the narrowest setting and a maximum covering, e.g. 60% or 72%, of the glass rod cross section and thus at the maximum of the reflected light; and an absolute value "ss" is sensed behind the reticle masking diaphragm. The same procedure is carried out at the greatest opening—0% covering—of the reticle masking diaphragm 7.

The absolute value "ss" is measured with a photodetector (spot sensor) (not shown in the drawing), which senses the whole pencil of light behind the reticle masking diaphragm 7. The photodetector can be placed directly behind the reticle masking diaphragm in the constriction of the illuminating system. For testing in operation, such a sensor can be introduced, for example, into the plane of the reticle 10 or of the wafer 12.

The calibration factor is then given by:

$$k=((es^{72}-es^0)-(ss^{72}-ss^0)/(el^{72}-el^0)).$$

Preferably, individual calibration factors "k" are determined for the different settings of the zoom axicon objective, corresponding to different illumination apertures or degrees of coherence σ in classical or ring aperture illumination.

Other correction procedures are also possible if more support locations with absolute values "ss" are measured. A look-up table, for example, can then also be prepared and evaluated.

The corrected measurement values from the calculating unit 201 are transmitted to the computer 200, which controls the whole system and, among other things, regulates the exposure time and determines the positions of the reticle masking diaphragm 7, the reticle 10, and the wafer 12 with the displacement unit 121.

The illumination measurement according to the invention can of course be arranged in all embodiments of projection illumination systems according to the invention.

I claim:

1. A light intensity measurement system in an illuminating system of a projection illumination system for microlithography, comprising:
   a light-mixing glass rod with a deflecting mirror that transmits a fraction of light intensity,
   an energy sensor that senses said transmitted fraction of light intensity,
   an adjustable diaphragm arranged following said glass rod in a direction of light flow, which reflects light back into said glass rod that in part reaches said energy sensor, and
   a compensation detector including a photodetector that senses said light reflected by said adjustable diaphragm.

2. The light intensity measurement system according to claim 1, in which said compensation detector includes a scattering disk in front of said photodetector.

3. The light intensity measurement system according to claim 1, in which said compensation detector includes a filter in front of said photodetector.

4. The light intensity measurement system according to claim 1, in which said compensation detector comprises a light trap.

5. The light intensity measurement system according to claim 1, in which said compensation detector is arranged near the deflecting mirror in a main direction of light reflected by said adjustable diaphragm.

6. A light intensity measurement system in an illumination system of a projection illumination system for microlithography, comprising:
   a deflecting mirror that supplies a fraction of light intensity to an energy sensor,
   an adjustable diaphragm arranged following said deflecting mirror in a light flow direction that reflects light back to said deflecting mirror that in part reaches said energy sensor, and
   a compensation detector including a photodetector that senses said light reflected from said adjustable diaphragm.

7. The light intensity measurement system according to claim 6 in which said adjustable diaphragm reflects back scattered light to said deflecting mirror.

* * * * *